United States Patent [19]
Bronner et al.

[11] Patent Number: 5,508,219
[45] Date of Patent: Apr. 16, 1996

[54] SOI DRAM WITH FIELD-SHIELD ISOLATION AND BODY CONTACT

[75] Inventors: Gary B. Bronner, Stormville, N.Y.;
John K. DeBrosse, Burlington, Vt.;
Jack A. Mandelman, Stormville, N.Y.

[73] Assignee: International Business Machines Corporation, Armonk, N.Y.

[21] Appl. No.: 461,958

[22] Filed: Jun. 5, 1995

[51] Int. Cl.[6] .................................. H01L 21/8242
[52] U.S. Cl. .................. 437/52; 437/21; 437/60; 437/919
[58] Field of Search ..................... 437/21, 47, 52, 437/60, 919; 257/300, 301, 305

[56] References Cited

U.S. PATENT DOCUMENTS

| | | | |
|---|---|---|---|
| 5,369,049 | 11/1994 | Acocella et al. | 437/52 |
| 5,384,277 | 1/1995 | Hsu et al. | 437/52 |

Primary Examiner—Tom Thomas

[57] ABSTRACT

An SOI deep-trench DRAM having body contacts and field shield isolation makes contact between the SOI device layer and the field shield layer at selected sites between adjacent deep trench capacitors. The field shield layer is biased negative to provide better isolation and to set the body potential of the array transistors.

16 Claims, 8 Drawing Sheets

SOI DRAM WITH FIELD-SHIELD ISOLATION AND BODY CONTACT

TECHNICAL FIELD

The technical field of the invention is that of silicon-on-insulator (SOI) circuits, in particular DRAMs.

BACKGROUND OF THE INVENTION

SOI technology has been researched for many years and has some well known advantages, in particular that of increased operating speed, lower capacitance, and the possibility of using lower voltage.

A well known problem in SOI technology is the need for a contact to the body of the transistor and the problem of making the contact without the consumption of too much space.

SUMMARY OF THE INVENTION

The invention relates to an SOI DRAM incorporating the use of a self-aligned body contact that is connected to a field shield that provides isolation.

DESCRIPTION OF THE PREFERRED EMBODIMENT

Figure 1:
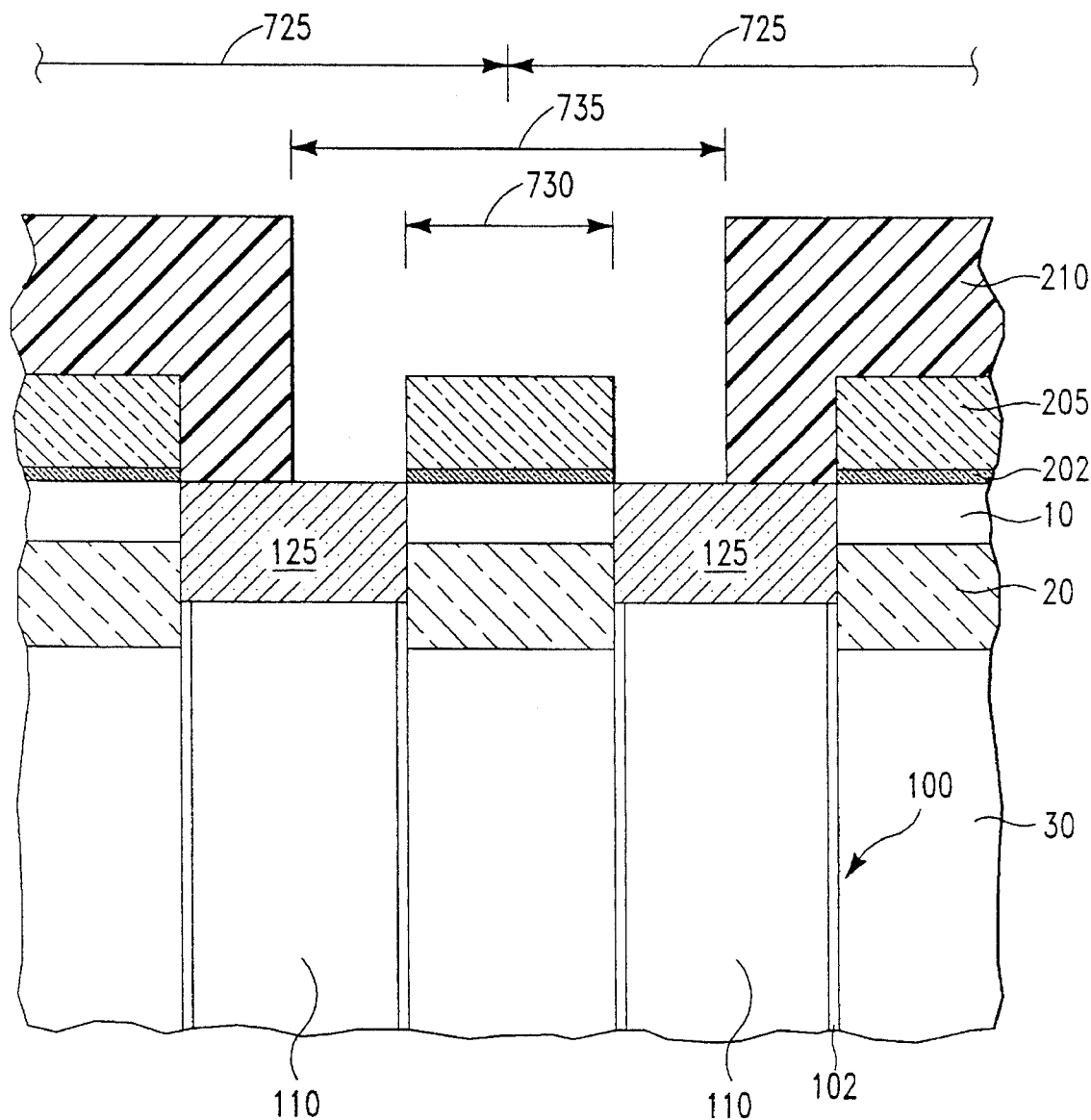
FIGS. 1 through 5 illustrate in cross-section a portion of a DRAM showing adjacent deep trench capacitors and associated body contact and field-shield isolation at various points in the fabrication process.

Referring to FIG. 1, there is illustrated in cross section a portion of a DRAM according to the invention after the performance of some initial steps. Conventional steps such as threshold or field implants are referred to as preparing the substrate. An SOI wafer having an n-type substrate 30, and oxide ($SiO_2$) layer 20 and p-type SOI (or device) silicon layer 10 for the formation of the (N-FET) transistors is used for starting material. The n-type substrate will be used for the storage capacitor plate in an n-channel array. In a complementary embodiment, a p-type substrate can be used with a P-type array (and even with an n-type array having reduced storage capacity). Conventional pad oxide 202 (8 nm) and nitride 205, $Si_3N_4$, (200 nm) layers are formed using standard processing.

A deep trench (DT) mask is used to pattern the wafer and a conventional ion etching process (sometimes called reactive ion etching, RIE) using HBR and $NF_3$ as the etchant in an Applied Materials 5000 etching tool is used to etch deep trenches 100 for the cell capacitors. Conventionally, the deep trenches may have a depth of between 1 and 8 μm.

A thin node dielectric 102 (illustratively formed by rapid thermal nitridation and re-oxidation in a known process) is formed in the deep trench capacitors as the capacitor dielectric. Other dielectrics may be used if preferred.

Trench 100 is filled with $N^+$ polycrystalline silicon (poly) 110 that is recessed by any convenient method such as RIE to a level below the junction between device layer 10 and oxide 20. In the inventive process, a conventional isolation collar that separates the upper portion of the capacitor node from plate 30 and the transistor is not used, providing greater storage capacity for a given trench depth. Poly 110 forms the interior electrode of the capacitors and substrate 30 forms the common electrode for the capacitor array.

The top of the trench is filled with poly 125 (may be $N^+$ or intrinsic poly depending on amount of buried strap outdiffusion desired) and recessed by any convenient method such as RIE such that top of poly 125 is substantially coplanar with SOI layer 10.

Figure 7A:
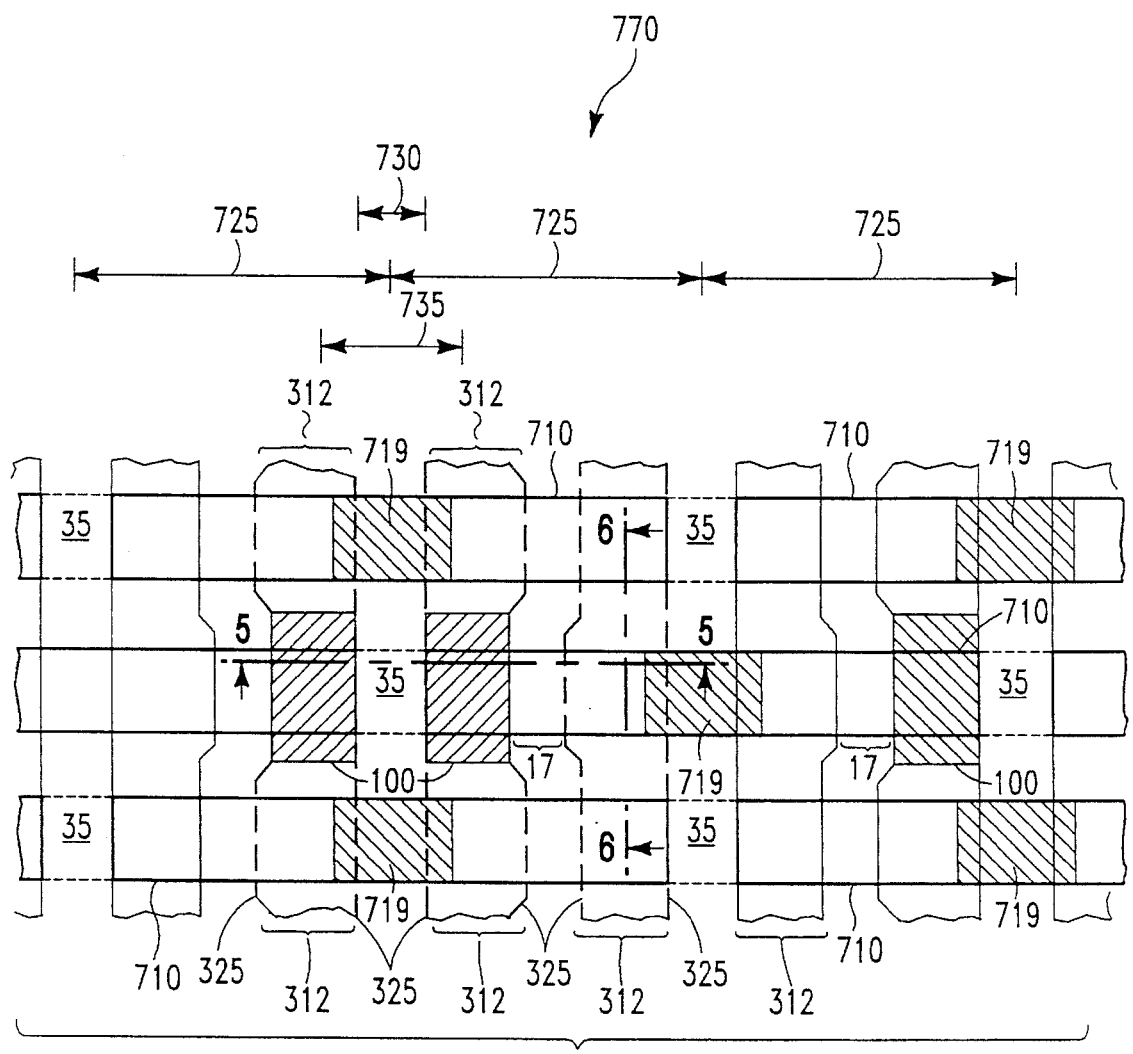
FIG. 7A shows a top view of a segment of a memory array.

A strap mask (ST mask) is used to define the pattern in photoresist 210 shown in FIG. 1, exposing half of a pair of neighboring trenches. The area between is protected by the pad nitride 205 and the strap is defined by the combination of the photoresist and the nitride between the trenches. A top view of the cell layout is shown in FIG. 7A, showing a set of arrows labelled with the numeral 725 that denote the length of a DRAM cell, an arrow labelled with the numeral 730 that denotes the length of the region within which the body contact will be formed, and an arrow labelled with the numeral 735 that denotes the aperture shown in FIG. 1. Corresponding arrows are shown in FIG. 1.

With strap mask photoresist 210 in place, a RIE operation is performed through polysilicon 125 in the deep trench, past the top of back oxide 20. The strap mask photoresist and nitride pad 205 form the mask for this RIE, which defines the strap connection between the center electrode of the capacitor and the transistor.

Figure 2:
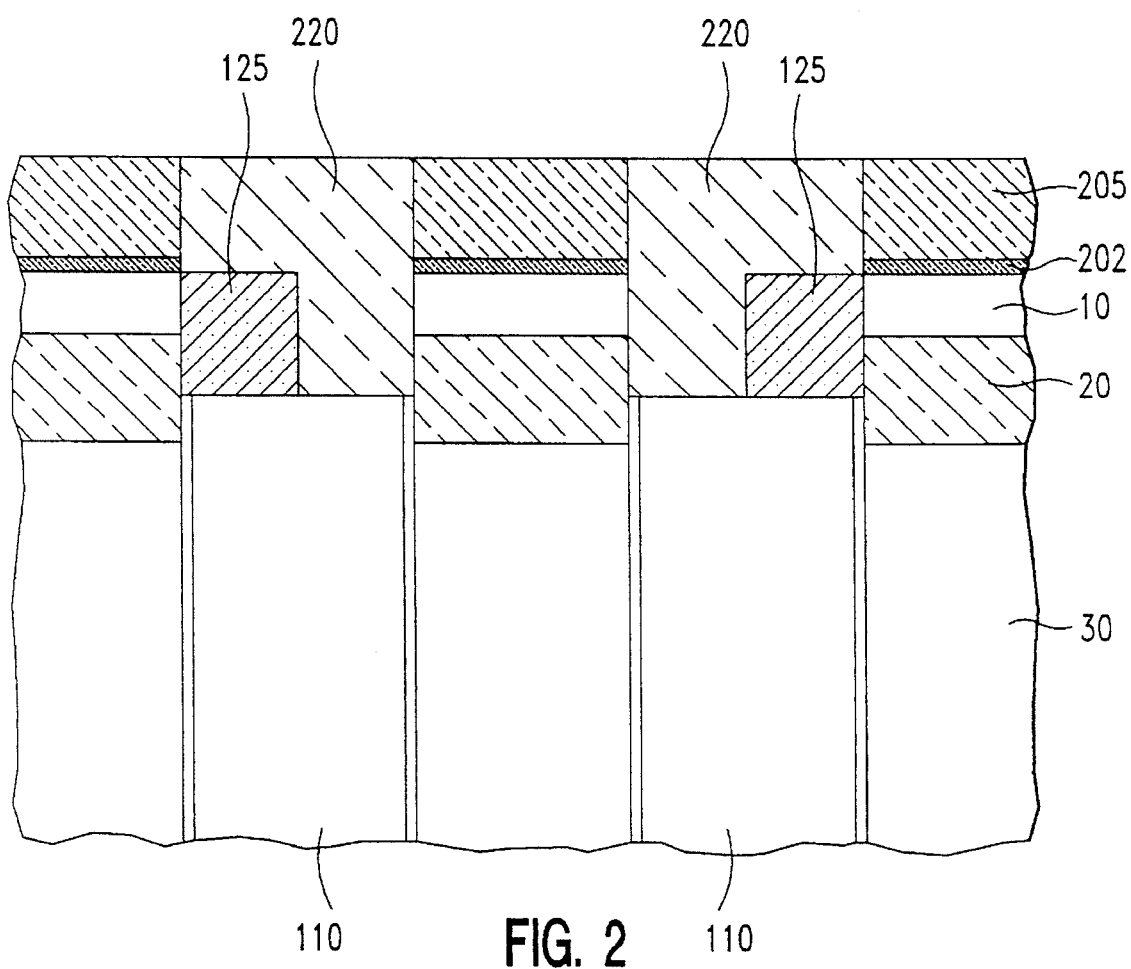

Referring to FIG. 2, the result of stripping photoresist 210 followed by depositing and planarizing tetraethoxysilane 220 (TEOS), using chemical-mechanical polishing, etchback or any other convenient technique, to the level of the nitride pad. 205. A smaller region of poly 125 remains as the strap for the cell, separated from the area in the center of the Figure that will contain the connection between the body contact and the field shield by TEOS 220. This method of connecting the body contacts to the field shield allows a folded bitline DRAM cell to be made in eight lithographic squares. Thus, there is no area penalty associated with the use of a body contact according to the invention.

Since the support logic circuits outside the array are CMOS, field-shield isolation in that area would take too much space because of the need to isolate NFETs and PFETs separately. Standard processing is thus used for shallow trench isolation in the supporting circuitry outside the array.

Figure 3:
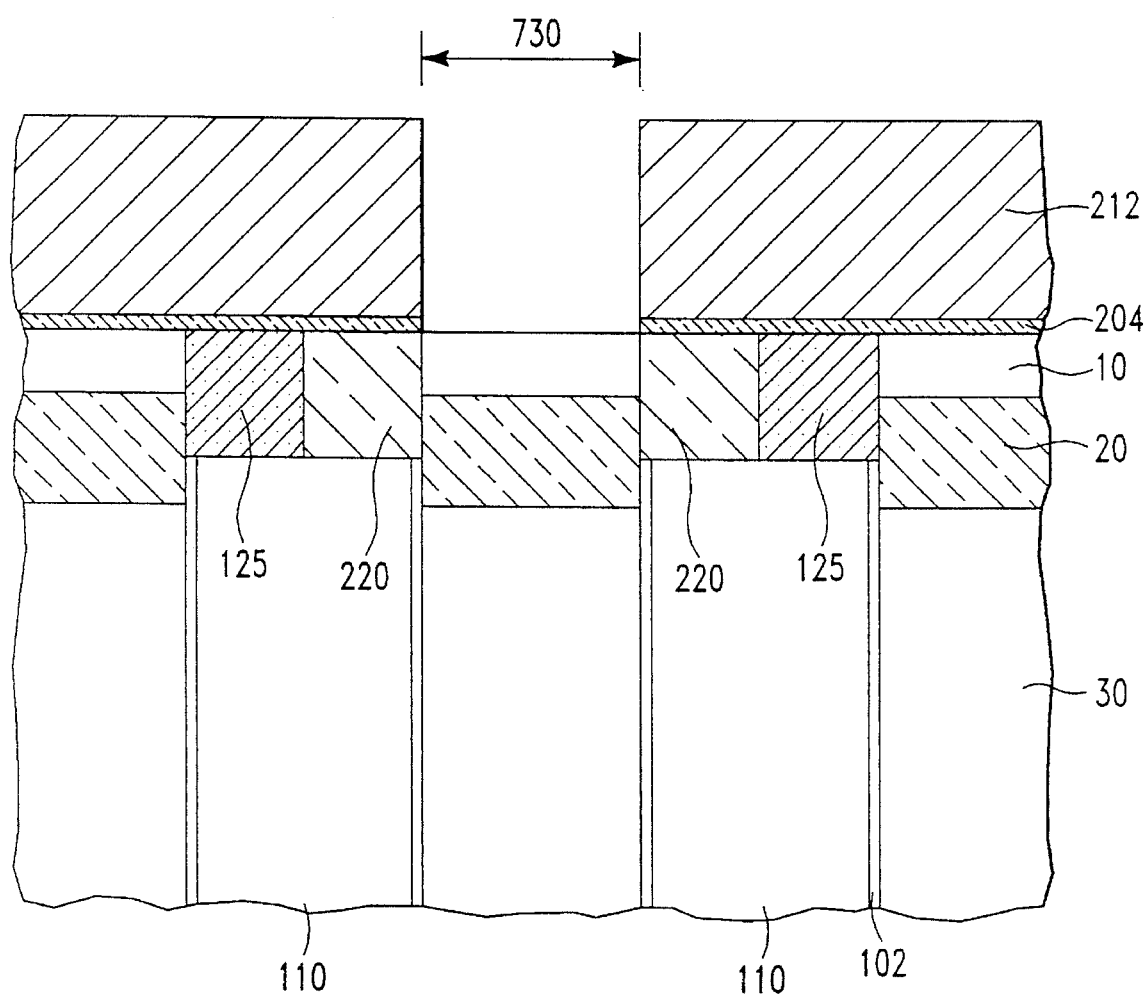

Referring now to FIG. 3, there is shown the same area as FIGS. 1 and 2 after stripping pad layers 202 and 205; growing sacrificial oxide 204 (8 nm); putting down and patterning photoresist 212 with the body contact mask and etching sacrificial oxide 204 in the exposed area to form aperture 730 that will contain the body contact. After stripping photoresist 212, an optional implant may be performed to adjust the threshold voltage of the N-FETs and/or P-FETs.

Figure 4A:
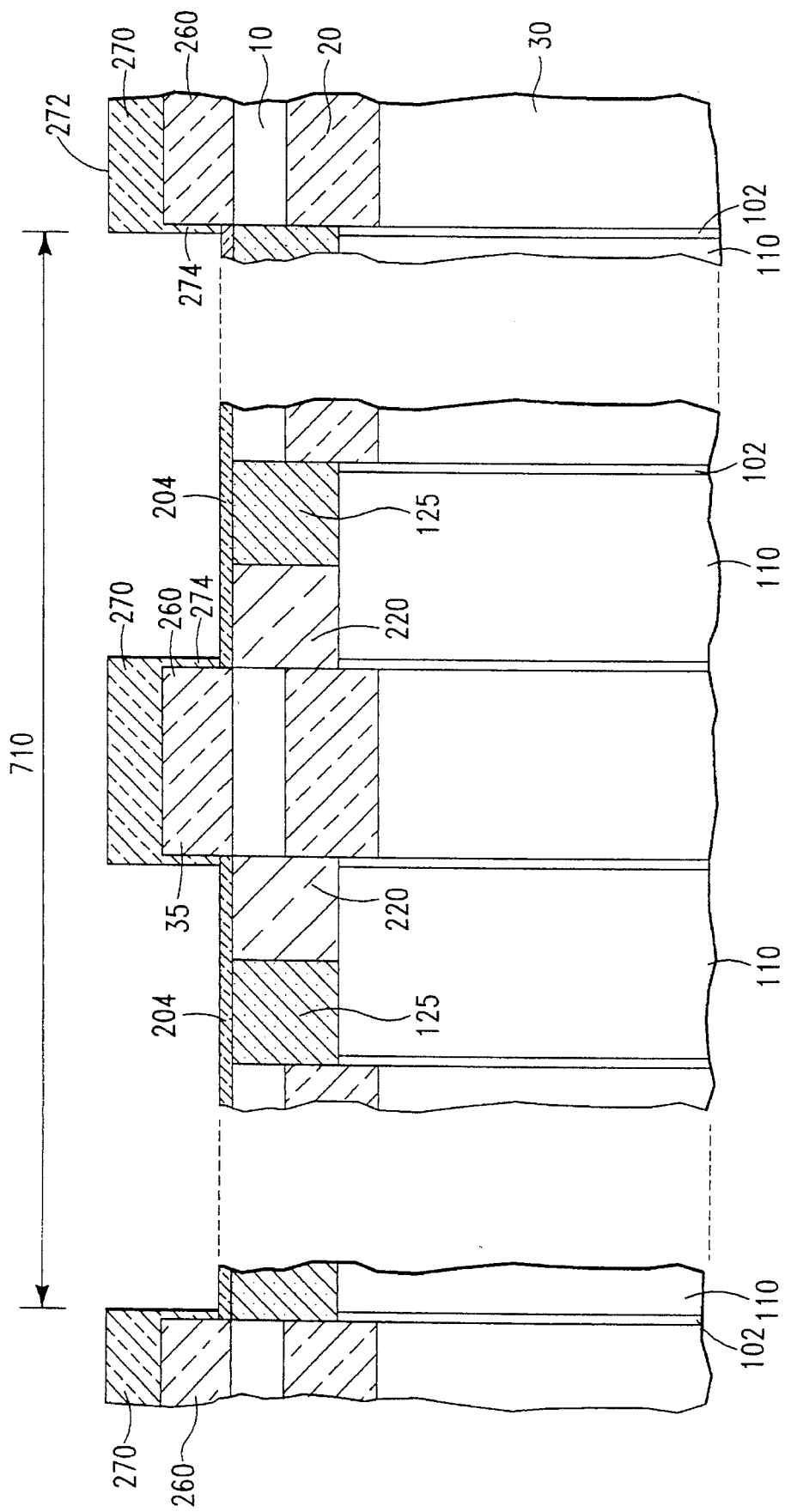

FIG. 4A shows the same area after depositing poly field shield layer 260 (100 nm) and field shield cap 270 (100 nm) over the array. Oxide 204 will also serve as the isolation oxide under the field-shield as well as sacrificial oxide in the active areas. Additionally, array active areas 710 have been opened in field-shield 260 with the FS mask and nitride spacers 274 have been formed on the exposed edges of field shield 260. The FS mask opens the field-shield where it is desired to later form the active device areas, body contacts and bitline contacts. Simultaneously with the formation of apertures 710, layers 270 and 260 are etched in the area of the support circuitry. The edges of the active area aperture 710 shown in FIG. 7A are denoted in FIG. 4A with an arrow labelled 710.

In the center of the figure, P⁺ poly 260 of the field shield makes contact with SOI layer 10 where oxide 204 has been etched away to form body contact 35. The placement of a body contact between every back-to-back pair of deep trenches is preferable, though it is not necessary, and body contacts may be staggered if other considerations make it preferable. Referring again to FIG. 7A, the apertures 710 in the top and bottom rows of the figure are separated by a blank space that is covered by the field shield, showing that the body contacts are adjacent to the trench capacitors. As can be seen, the body contact member connecting field shield 260 with device layer 10 is not adjacent to the transistor body. It is positioned, however, so that holes from several transistors may flow away from the bodies of those transistors to it and thus is a contact between field shield 260 and the transistor bodies. This invention provides a body contact between every pair of back-to-back deep trenches, which results in more effective equilibration of the body charge and lower effective field-shield resistance.

As can be seen, each active area aperture includes a pair of mirror image DRAM cells, separated by a common bitline contact and having their capacitors at opposite ends of the active area aperture. Preferably, every active area aperture is bracketed by a pair of body contacts that draw their current from transistor bodies in the neighboring rows (above and below the contact in the drawing).

Those skilled in the art will appreciate that the use of P⁺ poly provides an additional 1 V built-in bias for shutting off the isolation region, compared to the effect of N⁺ poly. Additionally, any boron diffusion through the isolation oxide will improve isolation.

A nitride spacer 274 has been formed on the edges of field-shield 260 by a conventional conformal deposition process such as LPCVD nitride deposition. Spacer 274 insures against shorting the field shield to the word lines that will be formed to the left and right of body contact 35.

Figure 4B:
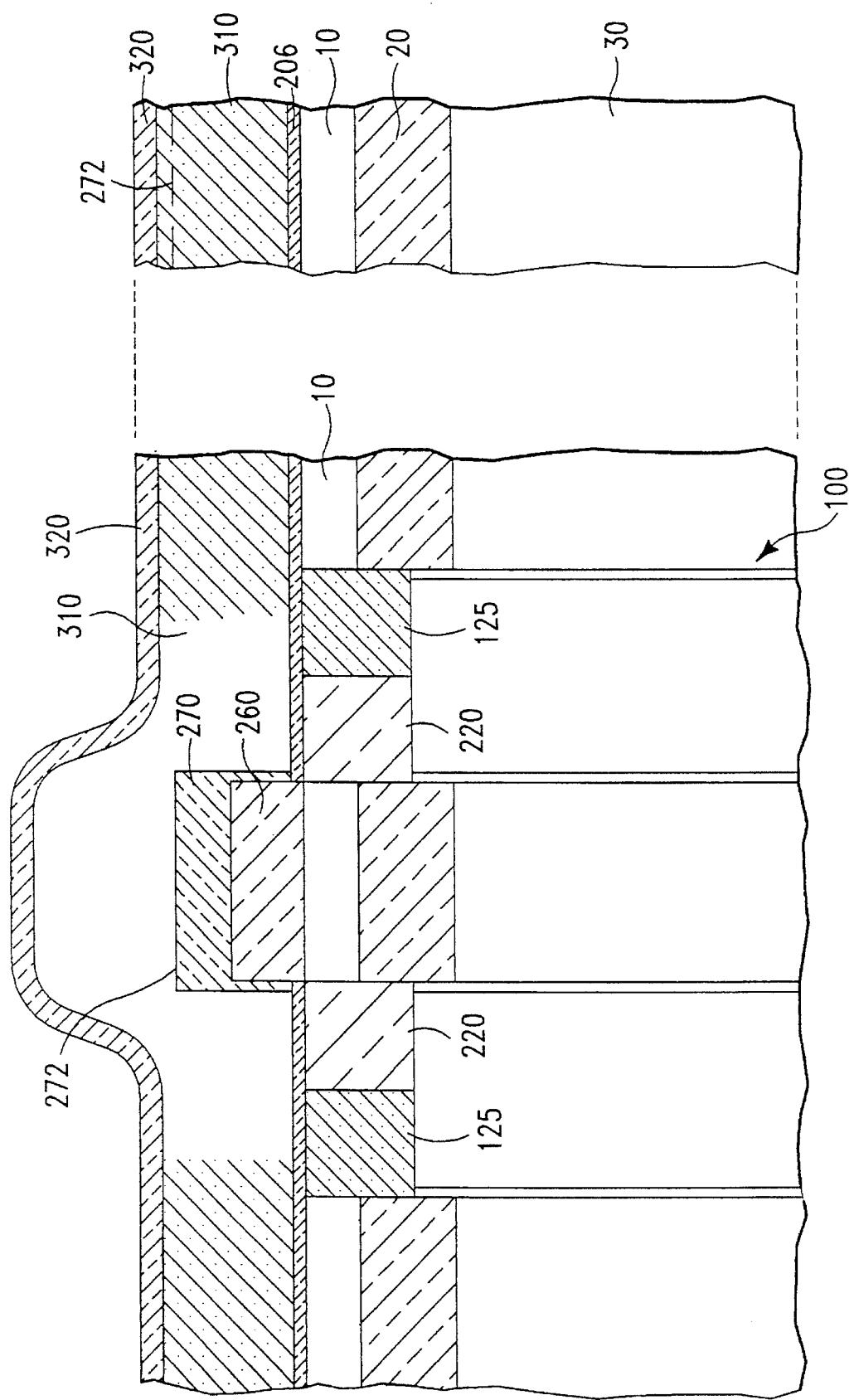

FIG. 4B shows the result of depositing poly layer 310 to the same depth as that of the field shield 260 plus nitride cap 270 and covering it with a second nitride cap 320. To the right of FIG. 4B, there is shown a portion of the support circuitry area showing poly 310 resting on gate oxide 206. The top surface 272 of the field shield cap 270, which will be used as a polish stop, defines a common surface inside the array that is the same as the nominal top surface of layer 310 outside the array. The figure has been drawn with the top surface of layer 310 above the height of surface 272 in order to illustrate that manufacturing tolerances will necessarily result in fluctuations in height.

Figure 5:
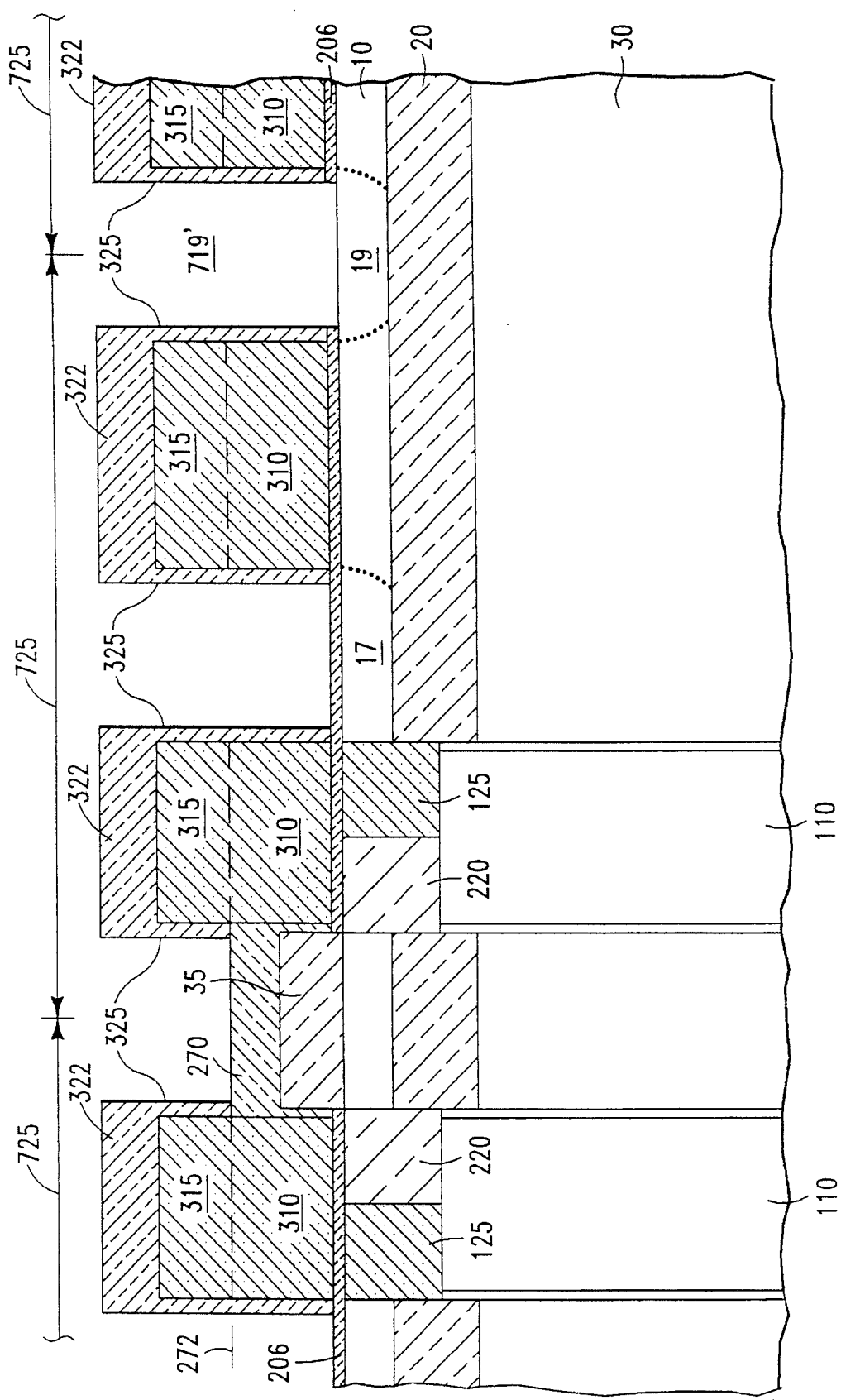

Referring now to FIG. 5, there is shown the area in FIGS. 1–4 plus the remainder of the DRAM cell. This view is the cross section indicated by 5—5 in FIG. 7A. Bracket 725 corresponds to one DRAM cell, extending from midway between the back to back trenches to midway through the bitline contact, indicated by arrows 725 in FIG. 7A.

FIG. 5 shows the result of removing the exposed sacrificial oxide 204 in the active areas; growing conventional gate oxide 206, illustratively to a thickness of 8 nm; depositing a first gate conductive poly layer 310 (also referred to as a gate contact layer) to substantially the same thickness as field shield layer 260 plus cap 270 and a nitride cap layer 320; and processing them as described below to provide improved planarity.

The area outside the array containing the support circuitry is masked and nitride cap layer 320 shown in FIG. 4B is stripped from GC layer 310 in the array. A chemical-mechanical polish (CMP) operation reduces the thickness of layer 310 to that of the field-shield 260 plus the cap 270, using the field shield cap 270 as a polish stop. The result of this operation is a common surface 272 inside the array and outside the array a similar surface that differs from 272 by the thickness of nitride cap 320 and the thickness tolerance of layer 310. Inside the array, surface 272, referred to as the gate contact top surface, is exposed and outside the array it lies between layer 310 and layer 320. Outside the array, the layer is uniform, since it has not yet been patterned, and within the array, there is a pattern of poly 310 inset into the active array apertures in field-shield 260. Such a pattern of inset conductors is referred to as damascene.

Next, nitride cap 320 is removed from poly 310 in the circuitry outside the array. A second gate conductive poly layer 315 (or other conductive layer) is deposited above the lower poly and nitride cap 322 is deposited above it. This leaves a poly composite gate conductive layer 310–315 over the areas that will be the gates and a single poly layer 315 over the field shield 260 (and field cap 270). The boundary between layers 310 and 315 is indicated with dotted lines in FIG. 5 and a phantom line denoted with the numeral 272 indicates the level of top surface 272 of the field cap.

Layers 322, 315 and 310 in array and outside the array are etched to define the gates, wordlines (and, optionally, local interconnects) both in the array and outside it. The damascene gate conductor process solves the depth of focus problem with the level of the gate conductors in the array vs. the supports by making the gate conductor height uniform in the support circuitry and in the array. A conventional implant for the sources and drains 17 and 19 is performed, after which nitride spacers 325 are formed on the edges of the gates. Since the sources and drains are implanted through the field shield aperture 710, the implant is blocked by the field shield outside the aperture. As indicated by the central arrow 725, a DRAM cell extends from the common diffusion 19 (common to a pair of cells) through the gate and past the edge of trench capacitor 100. Other arrows 725 to the left and right in the figure indicate neighboring cells. Strap 125 is made conductive by diffusion from poly 110 and electrode 17 at any convenient time, illustratively during annealing and oxidation steps.

The current flow from the transistor body is perpendicular to the plane of the paper in FIG. 5, since the cross section 5—5 in FIG. 7A has been taken through the active area aperture axis that passes through the transistor. Referring to FIG. 7A, it can be seen that the holes will flow from the area under the gates, denoted with brackets 312 upward or downward in FIG. 7A to body contact 35, formed where field shield layer 260 is in contact with layer 10.

Conventional steps such as depositing and planarizing phospho-silicate glass (PSG) or other dielectric layer, making contact to bit and word lines, and forming the interconnections in the array and in the support circuitry will be referred to as completing the circuit. As is known in the art, the gate contacts formed from layer 315 are the wordlines of the array (optionally supplemented by low-resistivity lines positioned above the lines shown in FIG. 5) and the bitlines will extend at right angles to the word lines. A bitline contact, shown as box 719 in FIG. 7A, will be formed in aperture 719' above diffusion 19 in FIG. 5 and a bitline (715 in FIG. 7A) will be formed above the bitline contact. The dotted lines 325 in FIG. 7A denote the nitride spacers 325 in FIG. 5 and serve to indicate the path of the poly gate layers. Similarly, dotted boxes 100 indicate deep trenches 100.

Figure 7:
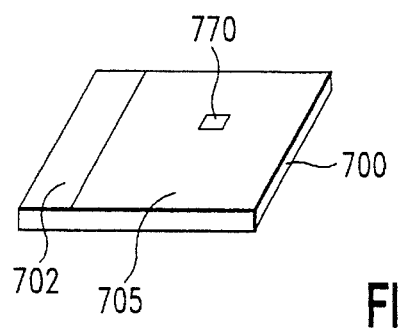
FIG. 7 shows an overall view of a memory chip including the portion shown in FIG. 7A.

Additionally, FIG. 7 shows schematically an overall view of an integrated circuit 700 according to the invention, in which I/O support circuitry is shown as block 702, including conventional I/O buffers, decoders, sense amplifiers and the like. The upper portion of the figure shows in detail a small portion 770 of memory array 705 of circuit 700.

Figure 6:
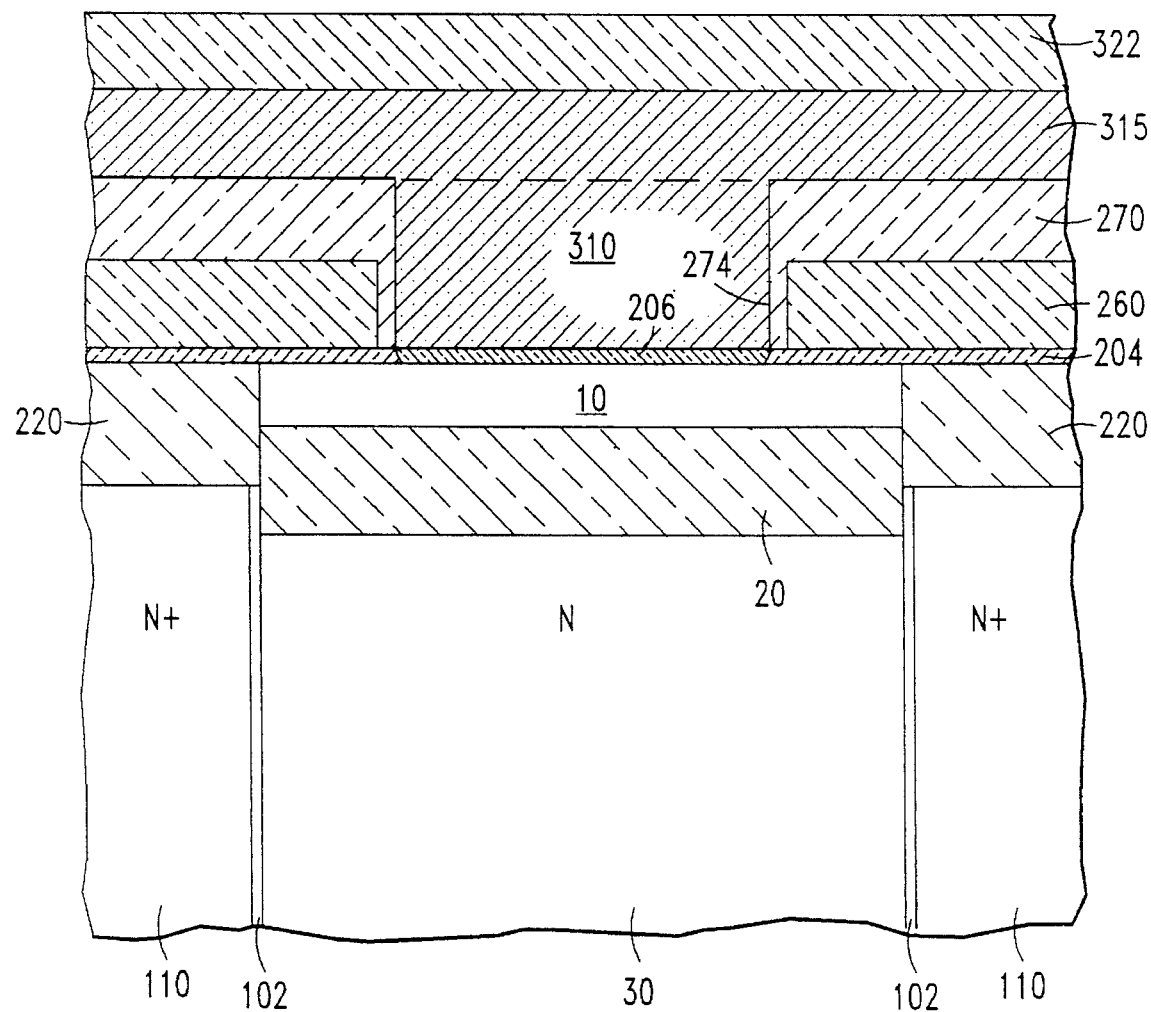
FIG. 6 shows an orthogonal cross section to that of FIGS. 1–5.

Referring now to FIG. 6, an orthogonal cross section along the line 6—6 in FIG. 7A is shown, illustrating the relation between the field shield 260, isolated by oxide 204, the damascene poly 310 and the wordline poly 315. TEOS 220 on the left and right of FIG. 6 are in the trench capacitors of the cells adjacent to the cell containing gate conductor 310.

Contact from a power bus to the field-shield is made at the edge of the memory array, setting the field shield and body potential.

Those skilled in the art will appreciate in the light of this disclosure that the present invention provides process simplification, improved wireability, more efficient body contacts, and lower field shield resistance compared to alternative methods. in addition, the isolation collar at the top of the deep trench that is characteristic of prior art deep trench DRAM cells is eliminated.

Various materials, deposition methods and etchants are not critical and those skilled in the art will readily be able to modify the steps listed or to substitute equivalents. The thicknesses and dopants indicated are intended for an illustrative circuit in which the array supply voltage is 2 V, the field shield and body are biased at −1 V, while substrate 30 is at ground. The word line is boosted to 3.5 V and the bitline is operated at 2 V. Those skilled in the art will readily appreciate that different embodiments of the invention, such as different bias values, a P-FET array with either an n- or p- type layer 10 may be made in view of the enclosed teaching and the following claims are not meant to be limited to the embodiments disclosed.

We claim:

1. A method of forming an SOI DRAM having a memory array having transistor body contacts in the memory array comprising the steps of:

preparing an SOI wafer having a semiconducting substrate, a semiconductor device layer above said substrate and an insulating layer between said substrate and said device layer;

forming a set of capacitors in contact with said semiconducting substrate in said memory array;

forming an isolation dielectric layer over said set of capacitors in said memory array;

forming a set of body contact apertures extending down through said isolation dielectric layer to said device layer;

forming a field shield having a field shield top surface and in electrical contact with said device layer in said memory array though said set of body contact apertures, thereby forming a set of body contacts in said body contact apertures;

forming a set of parallel active area apertures, each having an active area axis, in said field shield, at least some of said set of parallel active area apertures being adjacent to a member of said set of body contacts; and forming a set of transistors, having transistor bodies, in said device layer and below said active area apertures.

2. A method of forming an SOI DRAM according to claim 1, in which:

said step of forming a set of capacitors in said memory array comprises a step of forming a set of deep trenches through said device layer and said insulating layer and extending into said substrate; and forming a set of capacitors in said set of deep trenches.

3. A method of forming an SOI DRAM according to claim 2, in which:

said step of forming a set of transistors includes a step of forming a set of conductive gate contacts within said set of active area apertures and having a gate contact top surface coplanar with said field shield top surface.

4. A method of forming an SOI DRAM according to claim 3, further including a step of forming word lines connecting a plurality of said gate contacts along an axis perpendicular to said active area axes, said word lines being deposited on said gate contact top surface and said field shield top surface.

5. A method of forming an SOI DRAM according to claim 1, in which said steps of forming capacitors and transistors include forming within said active area apertures at least two DRAM cells along said active area axis, each cell containing a capacitor and a transistor connected to said capacitor, at least one of said capacitors being adjacent to a body contact area in said device layer.

6. A method according to claim 5, in which said at least two DRAM cells comprise first and second DRAM cells, said capacitors of said first and second cells being at opposite ends of said active area apertures, said first and second cells being separated by a common contact.

7. A method of forming an SOI DRAM according to claim 2, in which said steps of forming capacitors and transistors include forming within said active area apertures at least two DRAM cells along said active area axis, each cell containing a capacitor and a transistor connected to said capacitor, at least one of said capacitors being adjacent to a body contact area in said device layer.

8. A method according to claim 7, in which said at least two DRAM cells comprise first and second DRAM cells, said capacitors of said first and second cells being at opposite ends of said active area apertures, said first and second cells being separated by a common contact.

9. A method of forming an SOI DRAM having a memory array containing a first polarity of transistors and CMOS support circuitry containing said first polarity of transistors and a second polarity of transistors opposite said first polarity, those of said first polarity of transistors within said array having body contacts, comprising the steps of:

preparing an SOI wafer having a semiconducting substrate, a semiconductor device layer above said substrate and an insulating layer between said substrate and said device layer;

forming a set of capacitors in contact with said semiconducting substrate in said memory array;

forming an isolation dielectric layer over said set of capacitors in said memory array;

forming a set of body contact apertures extending down through said isolation dielectric layer to said device layer;

forming a field shield having a field shield top surface and in electrical contact with said device layer in said memory array though said set of body contact apertures, thereby forming a set of body contacts in said body contact apertures;

forming a set of parallel active area apertures, each having an active area axis, in said field shield, at least some of said set of parallel active area apertures being adjacent to a member of said set of body contacts; and simultaneously forming a first set of transistors of said first polarity in said device layer and below said active area apertures and a second set of transistors of said first polarity in said device layer in said support circuitry.

10. A method of forming an SOI DRAM according to claim 9, in which:

said step of forming a set of capacitors in said memory array comprises a step of forming a set of deep trenches through said device layer and said insulating layer and extending into said substrate; and forming a set of capacitors in said set of deep trenches.

11. A method of forming an SOI DRAM according to claim 10, in which:

said step of forming a set of transistors includes a step of depositing a first gate conductive layer inside and outside said array, forming a set of conductive gate contacts from said first gate conductive layer within said set of active area apertures and having a gate contact top surface substantially coplanar with said field shield top surface and with a first gate contact conductive layer top surface outside said array.

12. A method of forming an SOI DRAM according to claim 11, further including steps of depositing a second gate conductive layer in and outside said array, thereby forming a composite gate conductive layer outside said array;

patterning said second gate conductive layer to form word lines connecting a plurality of said gate contacts along an axis perpendicular to said active area axes in said array, said word lines being deposited on said gate contact top surface and said field shield top surface in said array, and patterning composite gate conductive layer to form transistor gates outside said array.

13. A method of forming an SOI DRAM according to claim 9, in which said steps of forming capacitors and transistors include forming within said active area apertures at least two DRAM cells along said active area axis, each cell containing a capacitor and a transistor connected to said capacitor, said capacitors being separated along said active area axis by a body contact area in said device layer.

14. A method according to claim 13, in which said at least two DRAM cells comprise first, second, third and fourth DRAM cells, said capacitors of said second and third cells being separated along said active area axis by said body contact area in said device layer.

15. A method of forming an SOI DRAM according to claim 10, in which said steps of forming capacitors and transistors include forming within said active area apertures at least two DRAM cells along said active area axis, each cell containing a capacitor and a transistor connected to said capacitor, said capacitors being separated along said active area axis by a body contact area in said device layer.

16. A method according to claim 15, in which said at least two DRAM cells comprise first, second, third and fourth DRAM cells, said capacitors of said second and third cells being separated along said active area axis by said body contact area in said device layer.

* * * * *